(12) United States Patent
Eriksson

(10) Patent No.: US 10,132,671 B2
(45) Date of Patent: Nov. 20, 2018

(54) PULSED RADAR LEVEL GAUGE WITH SINGLE OSCILLATOR

(71) Applicant: Rosemount Tank Radar AB, Mölnlycke (SE)

(72) Inventor: Mikael Eriksson, Västervik (SE)

(73) Assignee: ROSEMOUNT TANK RADAR AB, Molnlycke (SE)

( * ) Notice: Subject to any disclaimer, the term of this patent is extended or adjusted under 35 U.S.C. 154(b) by 242 days.

(21) Appl. No.: 15/281,387

(22) Filed: Sep. 30, 2016

(65) Prior Publication Data

US 2018/0094964 A1 Apr. 5, 2018

(51) Int. Cl.
*G01F 23/284* (2006.01)
*H03L 7/18* (2006.01)
(Continued)

(52) U.S. Cl.
CPC ............ *G01F 23/284* (2013.01); *G01S 7/282* (2013.01); *H03L 7/18* (2013.01); *H03L 7/23* (2013.01)

(58) Field of Classification Search
CPC .................................. G01S 7/35; G06F 1/0328
See application file for complete search history.

(56) References Cited

U.S. PATENT DOCUMENTS

| | | | |
|---|---|---|---|
| 4,943,787 A | 7/1990 | Swapp | |
| 6,486,826 B1 * | 11/2002 | Cramer | G01F 23/284 342/102 |

(Continued)

FOREIGN PATENT DOCUMENTS

| | | |
|---|---|---|
| EP | 2 199 761 | 6/2010 |
| EP | 2 207 263 | 7/2010 |
| EP | 2 495 634 | 9/2012 |

OTHER PUBLICATIONS

Notification of Transmittal of the International Search Report and the Written Opinion of the International Searching Authority from PCT/EP2017/074666, dated Jan. 2, 2018.

(Continued)

*Primary Examiner* — Bernarr E Gregory
(74) *Attorney, Agent, or Firm* — Westman, Champlin & Koehler, P.A.

(57) ABSTRACT

A pulsed radar level gauge for determining the filling level of a product contained in a tank, comprising a frequency generator for generating a Tx frequency signal and a Rx frequency signal. The frequency generator includes one single oscillating crystal for providing an oscillator frequency $f_{osc}$ and frequency modifying circuitry. The frequency modifying circuitry comprises a path including a PLL configured to receive said oscillator frequency $f_{osc}$ as input frequency and deliver a regulated output frequency being equal to the oscillator frequency $f_{osc}$ multiplied M/N, and a frequency divider connected to receive the regulated output frequency and deliver an output frequency equal to the regulated output frequency divided by an integer factor P. A PLL combined with an integer frequency divider is used to generate at least one of the Tx and Rx frequencies based on an oscillator frequency provided by one single oscillator.

17 Claims, 3 Drawing Sheets

(51) Int. Cl.
*G01S 7/282* (2006.01)
*H03L 7/23* (2006.01)
*G01F 23/00* (2006.01)
*G01S 7/00* (2006.01)
*G01S 13/00* (2006.01)

(56) References Cited

U.S. PATENT DOCUMENTS

| | | | |
|---|---|---|---|
| 6,621,449 B1* | 9/2003 | Kunert | G01S 7/35 332/126 |
| 6,628,229 B1 | 9/2003 | Johnson et al. | |
| 8,248,175 B2 | 8/2012 | Hara | |
| 8,416,124 B2* | 4/2013 | Gerding | G06F 1/0328 342/118 |
| 9,197,223 B2 | 11/2015 | Matsumura | |
| 2011/0102243 A1* | 5/2011 | Sai | G01S 7/35 342/124 |
| 2013/0076559 A1 | 3/2013 | Edvardsson | |
| 2013/0169368 A1* | 7/2013 | Rehman | H03L 7/18 331/18 |

OTHER PUBLICATIONS

"Delta-Sigma Modulation in Fractional-N Frequency Synthesis", by Tom A. et al., IEEE Journal of Solid-State Circuits, May 1993.
European Search Report from EP 16191947.7, dated Mar. 29, 2017.

* cited by examiner

PULSED RADAR LEVEL GAUGE WITH SINGLE OSCILLATOR

FIELD OF THE INVENTION

The present invention relates to a pulsed level gauge system with a single oscillator.

TECHNICAL BACKGROUND

Radar level gauge (RLG) systems are in wide use for determining the filling level of a product contained in a tank. Radar level gauging is generally performed either by means of non-contact measurement, whereby electromagnetic signals are radiated towards the product contained in the tank, or by means of contact measurement, often referred to as guided wave radar (GWR), whereby electromagnetic signals are guided towards and into the product by a probe acting as a waveguide. The probe is generally arranged to extend vertically from the top towards the bottom of the tank.

The transmitted electromagnetic signals are reflected at the surface of the product, and the reflected signals are received by a receiver or transceiver comprised in the radar level gauge. Based on the transmitted and reflected signals, the distance to the surface of the product can be determined. More particularly, the distance to the surface of the product is generally determined based on the time between transmission of an electromagnetic signal and reception of the reflection thereof in the interface between the atmosphere in the tank and the product contained therein. In order to determine the actual filling level of the product, the distance from a reference position to the surface is determined based on the above-mentioned time (the so-called time-of-flight) and the propagation velocity of the electromagnetic signals.

One category of RLG relates to so-called pulsed RLG systems that determine the distance to the surface of the product contained in the tank based on the difference in time (time-of-flight) between transmission of a pulse and reception of its reflection at the surface of the product.

Most pulsed radar level gauge systems employ Time Domain Reflectometry (TDR), which provides a time expansion of the (extremely short) time-of-flight. Such TDR radar level gauge systems generate a transmit pulse train having a first pulse repetition frequency Tx, and a reference pulse train having a second pulse repetition frequency Rx that differs from the transmitted pulse repetition frequency by a known frequency difference Δf. This frequency difference Δf is typically in the range of Hz or tens of Hz.

The transmit pulse train is emitted (non-contact or probe) towards the surface of a product contained in a tank, and the reflected signal is received and sampled with the reference pulse train. At the beginning of a measurement sweep, the transmission signal and the reference signal are synchronized to have the same phase. Due to the frequency difference, the phase difference between the transmission signal and the reference signal will gradually increase during the measurement sweep. This gradually shifting time sampling of the reflected signal will provide a time expanded version of the time-of-flight of the reflected pulses, from which the distance to the surface of the product contained in the tank can be determined.

It is clear that the frequency control of the Tx and Rx signals is critical for the performance of a TDR RLG. Several techniques are currently used to ensure such control.

According to one approach, two matched oscillators (crystals) are used. Two crystals requires a rather long start-up time, in order for the delta frequency to stabilize.

According to a second approach, one single oscillator (crystal) is used to generate both frequencies. One frequency is generated directly from the oscillator frequency or form an integer multiple of that frequency. The second frequency is generated by a gradually increasing phase shift of the first frequency. However, this solution requires components which are susceptible to drift between the two frequencies due to temperature variation and aging.

GENERAL DISCLOSURE OF THE INVENTION

It is an object of the present invention to provide a pulsed radar level gauge with improved frequency generation using a single oscillator.

According to a first aspect of the invention, this and other objects are achieved by a pulsed radar level gauge for determining the filling level of a product contained in a tank, comprising a frequency generator for generating a Tx frequency signal and a Rx frequency signal, wherein the Tx frequency is at least 10000 times greater than a difference frequency defined as a difference between the Tx and Rx frequencies, a transceiver for providing a transmit signal in the form of a pulse train having a pulse repetition frequency equal to the Tx frequency, and receiving a reflected signal resulting from a reflection of the transmit signal at a surface of the product, a propagating device connected to the transceiver for propagating the transmit signal towards the surface, and to return the reflected signal to the transceiver, sampling circuitry connected to the transceiver and to the frequency generator, and configured to sample the reflected signal with a sampling frequency equal to the Rx frequency in order to provide a time expanded tank signal and processing circuitry for determining the distance based on the time expanded tank signal. The frequency generator includes one single oscillating crystal for providing an oscillator frequency $f_{osc}$ and frequency modifying circuitry for generating the Tx frequency and the Rx frequency from the oscillator frequency. The frequency modifying circuitry comprises a first path configured to receive the oscillator frequency and deliver the Tx frequency, and a second path configured to receive the oscillator frequency and deliver the Rx frequency, at least one of the first and second paths including a PLL configured to receive said oscillator frequency $f_{osc}$ as input frequency and deliver a regulated output frequency being equal to the oscillator frequency $f_{osc}$ multiplied M/N, where M and N are integers with M>N, and a frequency divider connected to receive the regulated output frequency and deliver an output frequency equal to the regulated output frequency divided by an integer factor P.

With this design, a PLL combined with an integer frequency divider is used to generate at least one of the Tx and Rx frequencies based on an oscillator frequency provided by one single oscillator.

The invention is based on the realization that the improved accuracy of recently introduced PLLs, with improved limitation of sidebands (e.g. by including delta-sigma control), has made such PLLs useful for providing a precisely controlled delta frequency in the order of Hz.

It is noted that N may be equal to one, such that the PLL provides an integer multiplication of the oscillator frequency. Alternatively, the PLL includes a frequency divider providing a frequency division of the input frequency by a first integer factor N>1, and a phase control loop providing a frequency multiplication of the frequency divided input frequency by a second integer factor M. Such a PLL is referred to as a M/N PLL, or fractional PLL, and provides multiplication by a factor M/N with may be non integer.

In one embodiment, the both paths include PLLs. In this case, both Tx and Rx frequencies will be regulated.

In another embodiment, only one path includes a PLL, while the other path only includes an integer frequency divider.

In yet another embodiment, the radar level gauge comprises a power supply interface for receiving electrical power to said radar level gauge, an energy store for temporary storage of electrical power received by the power supply interface, and power management circuitry configured to power the frequency modifying circuitry from the energy store during a measurement sweep, and to charging the energy store during an idle period between two measurement sweeps.

Using an energy store enables use of frequency modifying circuitry which requires more power than what is provided by the power supply interface. This may be advantageous when the gauge is provided with a limited power, e.g. as provided by a two-wire control loop.

In other embodiments, the frequency modifying circuitry is configured to operate by means of the limited power provided by a two-wire interface, without the need of energy storage.

BRIEF DESCRIPTION OF THE DRAWINGS

The present invention will be described in more detail with reference to the appended drawings, showing currently preferred embodiments of the invention.

DETAILED DESCRIPTION OF PREFERRED EMBODIMENTS

Figure 1:
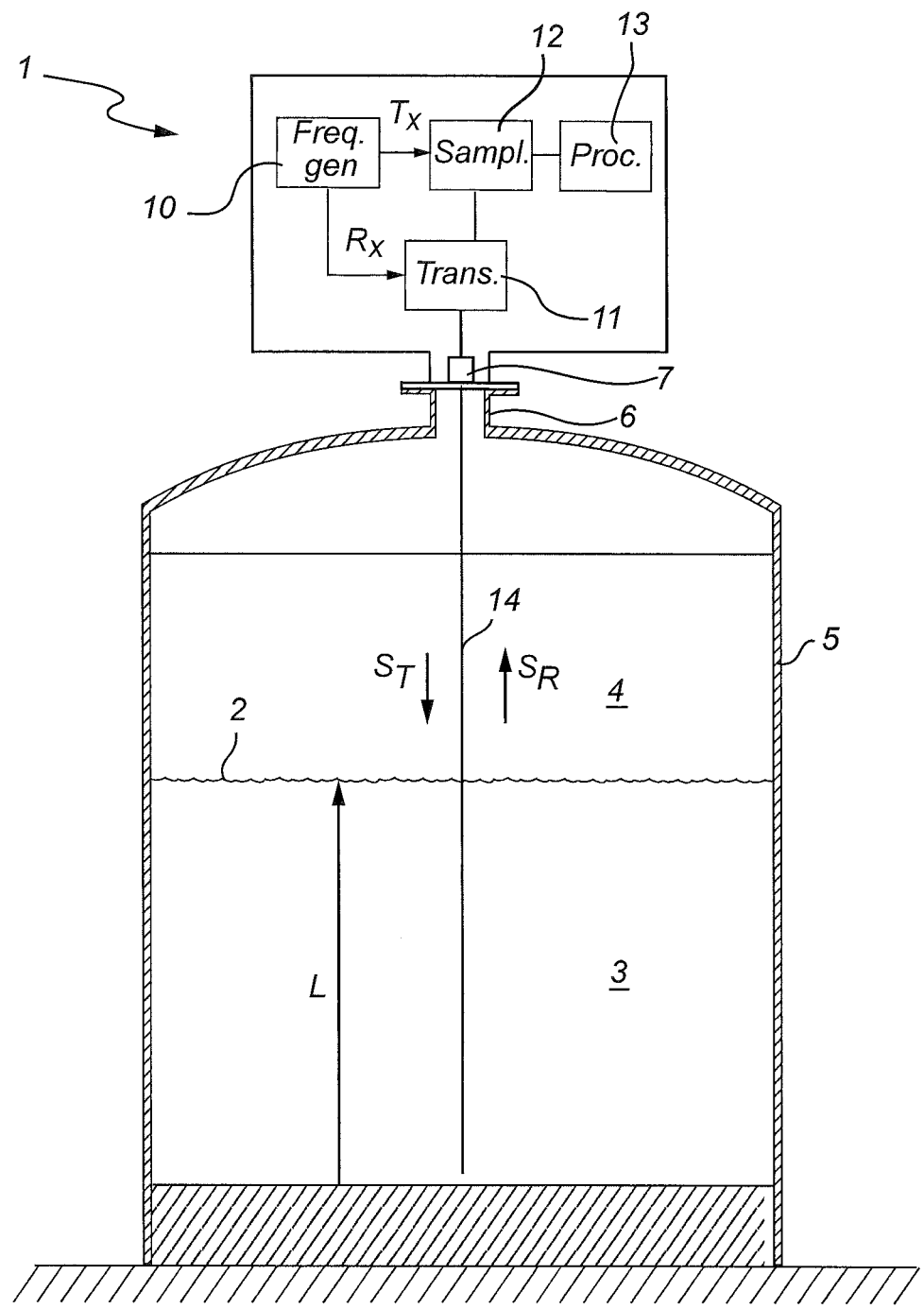
FIG. 1 shows schematically a radar level gauge.

FIG. 1 shows schematically a pulsed radar level gauge (RLG) 1 arranged to measure a distance to an interface 2 between two (or more) materials 3, 4 in the tank 5. Typically, the first material 3 is a product stored in the tank, e.g. a liquid such as gasoline, while the second material 4 is air or some other atmosphere. In that case, the RLG will enable detection of the distance to the surface 2 of the content 3 in the tank, and from this determine the filling level L.

The tank 5 is provided with a fastening structure 6 securing the RLG 1 in a measuring position fixed relative the bottom of the tank 5. The RLG 1 includes a feed through structure 7, allowing transmission of signals into and out of the tank. The feed through structure 7 may be arranged to provide process seal, capable of withstanding temperature, pressure, and any chemicals contained in the tank.

The RLG 1 comprises a frequency generator 10 for generating a Tx frequency signal connected to a transceiver 11 and a Rx frequency signal connected to sampling circuitry 12. As an example, suitable Tx and Rx frequencies are in the range 0.5-10 MHz, typically 1-2 MHz. Rx is preferably greater than Tx, although the opposite relationship is also possible. A critical aspect is the difference between the TX and Rx frequencies, which needs to be several orders of magnitude smaller than the Tx and Rx frequencies. As an example, the difference frequency is in the order of Hz, smaller than 15 Hz, although a slightly larger difference frequency may also be compatible with the technology.

The transceiver 11 is arranged to generate a transmit signal in the form of a pulse train having a pulse repetition frequency equal to the Tx frequency. The pulses may be DC pulses or be modulated by a carrier frequency. The carrier frequency may be in the order of GHz, e.g. 16 GHz or 25 GHz. The duration of the pulses may be in the order of ns, e.g. around 2 ns or less, in order to enable measurement of the relatively short distance between the gauge 1 and the surface 2. The pulses may have average power levels in the order of mW or μW.

The RLG 1 further comprises a propagating device 14 connected to the transceiver via the feed through structure 7. The feed through structure 7 this acts as an interface between the transceiver and the propagating device 14. The propagating device 14 is arranged to allow propagation of the transmit signal ST towards the surface 2, and to return a reflected signal SR resulting from a reflection of the transmit signal at a surface 2 of the product 3.

In the illustrated example, the RLG 1 is a guided waver radar (GWR), and the signal propagating device 14 is a probe extending from the RLG 1 to the bottom of the tank 5. The probe can be e.g. a coaxial wire probe, a twin wire probe, or a single wire probe (also referred to as a surface wave guide). Electromagnetic waves transmitted along the probe 14 will be reflected by any interface 2 between materials in the tank, and the reflection will be transmitted back to the transceiver 11 via the feed through structure 7.

Alternatively, RLG is a non-contact RLG, and the propagating device is a directional antenna, such as a horn antenna, arranged to emit the transmitted waves to freely propagate into the tank, and to receive waves that are reflected by any interface 2 between materials in the tank.

The transceiver includes a coupling device allowing the transceiver to transmit the transmit signal to the propagating device while simultaneously receiving the reflected signal from the propagating device 14. The coupling device may be some sort of directional coupler, a circulator, or a solid state switch.

The sampling circuitry 12, which is connected to the transceiver 11 and to the frequency generator 10, is configured to sample the reflected signal with a sampling frequency equal to the Rx frequency in order to provide a time expanded tank signal. The time expanded tank signal, also referred to as a time domain reflectometry (TDR) signal, is A/D converted.

The RLG further comprises processing circuitry 13 for determining the distance based on the digitized TDR signal. The circuitry 13 is provided with software for analyzing the TDR signal in order to determine a process variable in the tank, typically the level L of the surface 2. The processing circuitry may include a memory, typically comprising a ROM (e.g. an EEPROM) for storing pre-programmed parameters, and a RAM for storing additional software code executable by a microprocessor.

Figure 2:
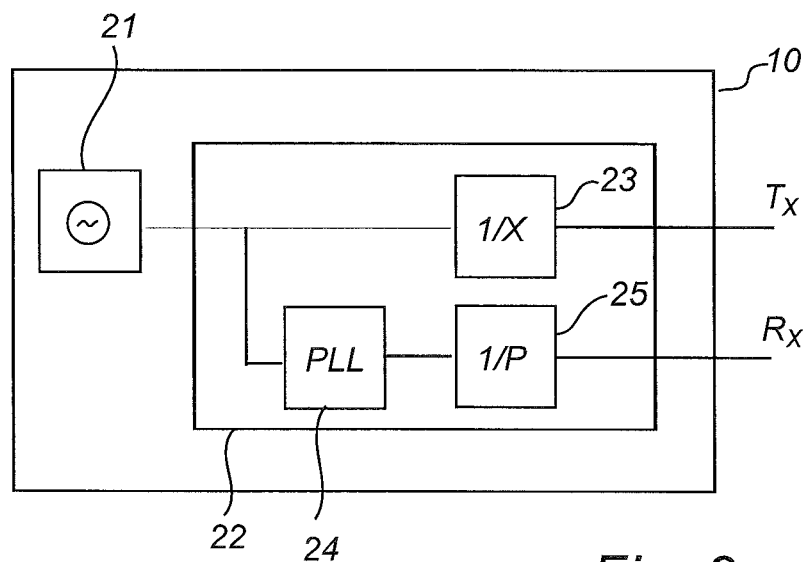
FIG. 2 shows a block diagram of a frequency generator according to a first embodiment of the invention.
Figure 3:
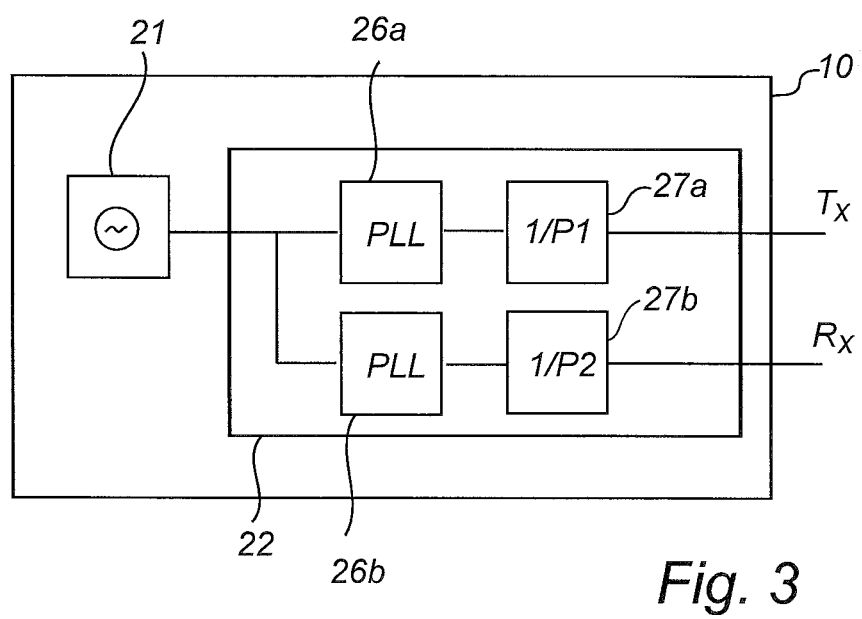
FIG. 3 shows a block diagram of a frequency generator according to a second embodiment of the invention.

FIGS. 2 and 3 shows two embodiments of the frequency generator 10 in FIG. 1. The frequency generator 10 includes one single oscillating crystal 21 for providing a oscillator frequency $f_{osc}$. The oscillating frequency is preferably in the range 10-100 MHz, and typically 50 MHz or lower, e.g. 25 MHz. This oscillator frequency $f_{osc}$ is provided to a frequency modifying circuitry 22 for generating the Tx and Rx frequencies mentioned above. Typically, although not necessarily, the frequency modulating circuitry provides frequency division of the oscillator frequency $f_{osc}$ so that the Tx and Rx frequencies are lower than the oscillator frequency.

As shown in greater detail in FIGS. 2 and 3, the frequency modifying circuitry 22 includes a first path configured to receive the oscillator frequency and provide the Tx frequency, and a second path configured to receive the oscillator frequency and provide the Rx frequency.

In FIG. 2, the first path includes a frequency divider 23 configured to receive the oscillator frequency $f_{osc}$ as input frequency and deliver a first output frequency equal to the oscillator frequency $f_{osc}$ divided by an integer X. The second path includes a PLL 24 configured to receive multiply the oscillator frequency $f_{osc}$ by a factor M/N, where M and N are integers with M>N, and a frequency divider 25 connected to receive the regulated output frequency and deliver an output frequency equal to the regulated output frequency divided by an integer factor P.

In FIG. 2, the Tx frequency, is not regulated (e.g. by a phase lock loop), but the oscillator frequency is typically sufficiently stable. It is also noted that integer frequency division (as performed by frequency divider 25) does not deteriorate the phase lock signal.

In FIG. 3, the frequency modifying circuitry 22 includes two paths each including a PLL 26a, 26b and a frequency divider 27a, 27b. The first path is configured to provide frequency multiplication by a factor M1/N1, with M1>N1, and frequency division by an integer factor P1. The second path is configured to provide frequency multiplication by a factor M2/M2, with M2>N2, and frequency division by an integer factor P2.

In this case, both output frequencies will be regulated frequencies. Depending on the choice of parameters M1, N1, P1, M2, N2, P2, both output frequencies may further be non-integer multiples of the oscillator frequency. However, it is of course possible that one of the output frequencies is an integer multiple of the oscillator frequency (e.g. that M2/N2/P2 is an integer).

Figure 4:
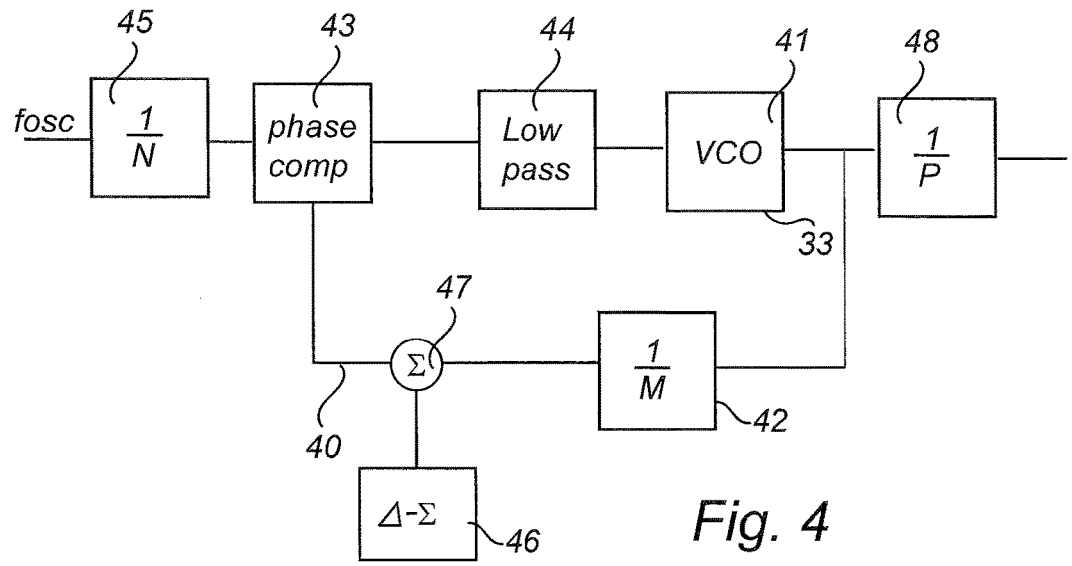
FIG. 4 shows a block diagram of an embodiment of the paths in FIGS. 2 and 3.

FIG. 4 shows schematically an example of the second path in FIG. 2 (or either path in FIG. 3). A phase control loop 40 includes a voltage controlled oscillator (VCO) 41, and a frequency divider 42 configured to divide the output from the VCO 41 by a factor M. A phase comparator 43 is connected to receive the output from the frequency divider 42 as well as a reference frequency $f_{ref}$. The output from the phase comparator is low pass filtered by a filter 44, and then connected to the VCO 41 to adjust the frequency. This phase feedback control of the VCO 41 will cause it to stabilize at a frequency equal to the reference frequency multiplied by M. The multiplied frequency $M \times f_{ref}$ will be regulated, i.e. locked in phase and frequency.

Immediately upstream the phase comparator is a second frequency divider 45, configured to divide an input frequency (in our case the oscillator frequency $f_{osc}$) by a factor N. This further frequency divider results in an output frequency equal to the input ($f_{osc}$) multiplied by a factor M/N. The combination of the frequency divider 45 and the PLL 40 is sometimes referred to as an M/N PLL. If N is greater than M, then the output frequency will be smaller than the input frequency.

In order to shrink sidebands created by periodic changes, the M/N PLL is further provided with a delta-sigma modulator 46 connected to the feedback path in a summation 47. The resulting circuit is referred to as a delta-sigma PLL.

In the illustrated example, it is required to generate two frequencies Tx and Rx with a difference frequency which is several orders of magnitude smaller than these frequencies. In some applications, the Tx frequency is $10^6$ times greater than the difference frequency. In order to enable such resolution in the PLL, the divider needs to be large. However, it is typically preferable to avoid that the reference frequency provided to the phase control loop 40 is too small, and therefore the factor N cannot be too large. Therefore, the circuit in FIG. 4 is provided with yet another frequency divider 48 downstream the phase control loop 40. The frequency divider 48 is configured to divide the regulated frequency from the M/N PLL by an integer factor P.

In theory, the frequency divider 45 can be completely eliminated, and the entire frequency division can take place downstream in the frequency divider 48. However, if the intention is to have high resolution this requires a very large P, which in turn requires that the VCO 41 is capable of generating very high frequencies. Therefore, in a typical embodiment suitable for the present invention, the frequency division will be performed in two steps. First, with an integer factor N in the first frequency divider 45 provided upstream the control loop, and then with an integer factor P in the second frequency divider 48 provided downstream the control loop.

The circuitry in FIG. 3 may advantageously be implemented using a single IC circuit, including the crystal oscillator 21, two M/N PLLs and two frequency dividers. An example of such a circuit is the Si5351A (10-MSOP) circuit from Silicon Labs Inc. In this circuit, the frequency dividers following the PLLs are so called fractional frequency dividers. However, for purposes of the present invention, they are preferably used as integer frequency dividers.

Alternatively, the frequency modifying circuitry 22 is implemented in a functional programmable gate array (FPGA) connected to a suitable crystal oscillator.

The crystal in the Si5351A-circuit has an oscillating frequency of 25 or 27 MHz which is compatible with the present invention. However, an advantage with using a FPGA over the Si5351A-circuit is that a crystal with a slightly higher oscillating frequency, such as 50 MHz, may be used. This may be advantageous, but in many applications there is also a tradeoff with power consumption.

In a concrete example using the Si5351A-circuit, the oscillator frequency $f_{osc}$ delivered by the crystal 21 is 27 MHz, N is equal to 80659, M is equal to 65535, and P is equal to 13. This results in a combined factor M/N/P=0.062499592763905 (approx). This results in a frequency approximately equal to 1.687488 MHz, which may be used as Tx frequence. An Rx frequency can be generated by choosing factors which result in a frequency division by 16, resulting in an Rx frequency of 1.6875 Mz. The difference frequency Rx-Tx will then be approximately 11.2 Hz.

Figure 5:
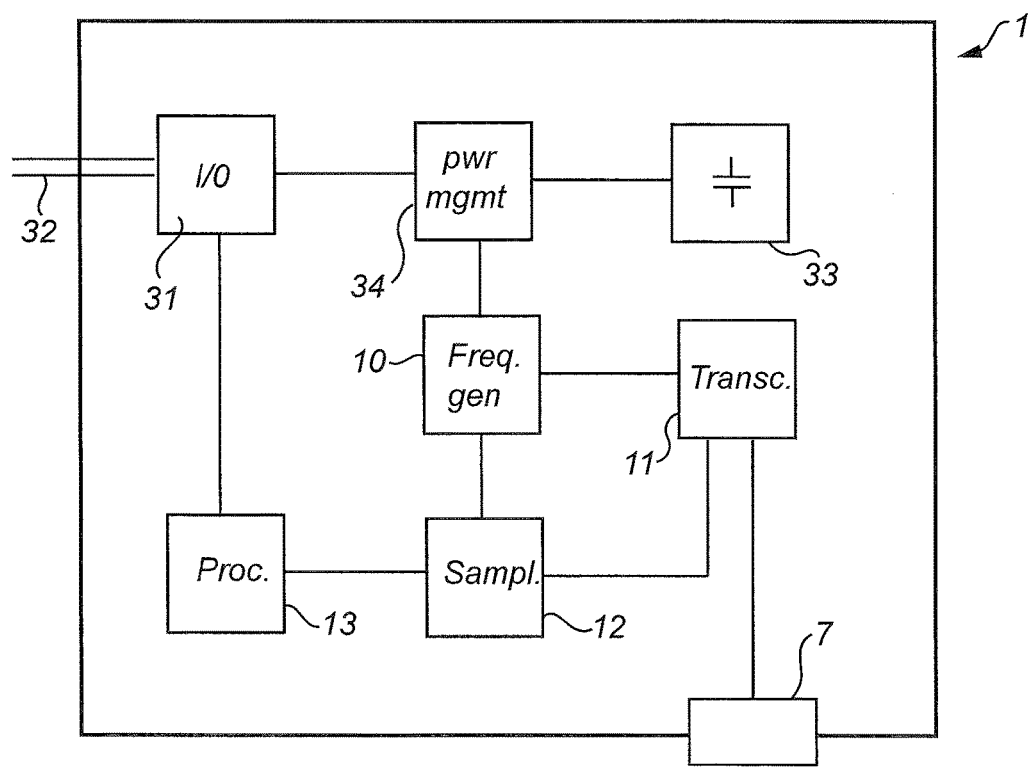
FIG. 5 shows a block diagram of a radar level gauge provided with an energy store and power management circuitry.

With reference to FIG. 5, the RLG 1 may be provided with a power supply interface 31 which provides the RLG 1 with a limited power. For example, the RLG 1 may be connected to a two-wire control loop 32, which may only provide 4 mA at a limited voltage. In such applications, operation of the PLL(s) 24, 26a, 26b may require more power than what is available from the power supply interface. To overcome this potential problem, the RLG 1 may then be provided with an energy store 33 and power management circuitry 34 connected to the energy store 33. The power management circuitry 34 can be configured to power the electronics of the RLG 1, including the frequency generator 10, from the energy store 33 during a measurement sweep, while recharging the energy store during an idle period between two measurement sweeps. By ensuring that the idle period is longer than the measurement sweep, the RLG 1, including the frequency generator 10, can be provided with a greater power during a measurement sweep than the power that is available through the power supply interface.

The person skilled in the art realizes that the present invention by no means is limited to the preferred embodiments described above. On the contrary, many modifications and variations are possible within the scope of the appended claims. For example, the frequency modifying circuitry can be designed to operate also with the limited power available from a two-wire control loop, thereby avoiding the need for energy storage.

What is claimed is:

1. A pulsed radar level gauge for determining the filling level of a product contained in a tank, comprising:
    a frequency generator for generating a Tx frequency signal and a Rx frequency signal, wherein the Tx frequency is at least 10000 times greater than a difference frequency defined as a difference between the Tx and Rx frequencies;
    a transceiver for providing a transmit signal in the form of a pulse train having a pulse repetition frequency equal to the Tx frequency, and receiving a reflected signal resulting from a reflection of the transmit signal at a surface of the product;
    a propagating device connected to the transceiver for propagating said transmit signal towards the surface, and to return the reflected signal to the transceiver;
    sampling circuitry connected to the transceiver and to the frequency generator, and configured to sample the reflected signal with a sampling frequency equal to the Rx frequency in order to provide a time expanded tank signal; and
    processing circuitry for determining said distance based on the time expanded tank signal;
    wherein the frequency generator includes:
    one single oscillating crystal for providing an oscillator frequency $f_{osc}$ and frequency modifying circuitry for generating said Tx frequency and said Rx frequency from the oscillator frequency,
    said frequency modifying circuitry comprising a first path configured to receive said oscillator frequency and deliver said Tx frequency, and a second path configured to receive said oscillator frequency and deliver said Rx frequency,
    at least one of said first and second paths including a PLL configured to receive said oscillator frequency $f_{osc}$ as input frequency and deliver a regulated output frequency being equal to the oscillator frequency $f_{osc}$ multiplied by a factor M/N, where M and N are integers with M>N, and a frequency divider connected to receive the regulated output frequency and deliver an output frequency equal to the regulated output frequency divided by an integer factor P.

2. The pulsed radar level gauge according to claim 1, wherein N=1.

3. The pulsed radar level gauge according to claim 1, wherein the PLL includes a frequency divider providing a frequency division of the input frequency by a first integer factor N>1, and a phase control loop providing a frequency multiplication of the frequency divided input frequency by a second integer factor M.

4. The pulsed radar level gauge according to claim 1, wherein the PLL includes limitation of sidebands.

5. The pulsed radar level gauge according to claim 4, wherein the limitation of sidebands is achieved by delta-sigma modulation.

6. The pulsed radar level gauge according to claim 1, wherein the first path comprises:
    a first frequency divider configured to receive said oscillator frequency as input frequency and deliver an output frequency equal to the oscillator frequency $f_{osc}$ divided by an integer factor X, and
    the second path includes:
    a PLL configured to receive said oscillator frequency $f_{osc}$ as input frequency and deliver a regulated output frequency being equal to the oscillator frequency $f_{osc}$ multiplied M/N, where M and N are integers with M>N, and
    a second frequency divider connected to receive the regulated output frequency and deliver an output frequency equal to the regulated output frequency divided by an integer factor P.

7. The pulsed radar level gauge according to claim 1, wherein the first path includes:
    a first PLL configured to receive said oscillator frequency $f_{osc}$ as input frequency and deliver a first regulated output frequency being equal to the oscillator frequency $f_{osc}$ multiplied by a first factor M1/N1, where M1 and N1 are integers with M1>N1, and
    a first frequency divider connected to receive the first regulated output frequency and deliver a first output frequency equal to the first regulated output frequency divided by an integer factor P1;
    and the second path includes:
    a second PLL configured to receive said oscillator frequency $f_{osc}$ as input frequency and deliver a second regulated output frequency being equal to the oscillator frequency $f_{osc}$ multiplied by a second factor M2/N2, where M2 and N2 are integers with M2>N2, and
    a second frequency divider connected to receive the second regulated output frequency and deliver a second output frequency equal to the second regulated output frequency divided by an integer factor P2,
    wherein at least one of M1/N1 and M2/N2 is a non-integer factor.

8. The pulsed radar level gauge according to claim 1, further comprising:
    a power supply interface for receiving electrical power to said radar level gauge;
    an energy store for temporary storage of electrical power received by the power supply interface; and
    power management circuitry configured to power the frequency modifying circuitry from the energy store during a measurement sweep, and to charging the energy store during an idle period between two measurement sweeps.

9. The pulsed radar level gauge according to claim 8, wherein the power supply interface is a two-wire control loop.

10. The pulsed radar level gauge according to claim 1, further comprising a two-wire control loop interface for receiving electrical power to the radar level gauge, wherein the two-wire control loop provides sufficient power for operation of the frequency modifying circuitry without any energy storage.

11. The pulsed radar level gauge according to claim 1, wherein the oscillator frequency $f_{osc}$ is in the range 10-100 MHz.

12. The pulsed radar level gauge according to claim 1, wherein the Tx and Rx frequencies are in the range 0.5-5 MHz.

13. The pulsed radar level gauge according to claim 1, wherein the difference frequency is smaller than 20 Hz.

14. The pulsed radar level gauge according to claim 1, wherein the Tx frequency is 1000000 times greater than the difference frequency.

15. The pulsed radar level gauge according to claim 1, wherein pulses in the transmit signal are DC pulses.

16. The pulsed radar level gauge according to claim 1, wherein pulses in the transmit signal are modulated by a carrier frequency in the order of GHz.

17. The pulsed radar level gauge according to claim 1, wherein the frequency generator consists of one single integrated circuit.

* * * * *